(12) United States Patent
Swanson

(10) Patent No.: US 6,392,580 B1
(45) Date of Patent: May 21, 2002

(54) ANALOG TO DIGITAL CONVERTER HAVING DIGITAL SIGNAL PROCESSING WITH A NEGATIVE LOGIC SUPPLY RAIL

(75) Inventor: Eric J. Swanson, Buda, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/330,069

(22) Filed: Jun. 11, 1999

(51) Int. Cl.[7] ................................................. H03M 1/12

(52) U.S. Cl. ........................................... 341/155; 607/2

(58) Field of Search ................................ 341/155, 156, 341/172, 118, 119, 120; 607/2; 331/158; 327/530, 535, 536

(56) References Cited

U.S. PATENT DOCUMENTS

| | | | |
|---|---|---|---|
| 5,266,842 A | | 11/1993 | Park |
| 5,300,835 A | | 4/1994 | Assar et al. |
| 5,440,244 A | | 8/1995 | Richter et al. |
| 5,481,229 A | * | 1/1996 | Connell et al. ............. 331/158 |
| 5,729,229 A | | 3/1998 | Kasha et al. |
| 5,764,541 A | * | 6/1998 | Hermann et al. ........... 364/571 |
| 6,091,987 A | * | 7/2000 | Thompson ..................... 607/2 |

OTHER PUBLICATIONS

"Charge Pumps Convert Power Efficiently Without Inductors", F. Goodenough, Electronic Design, Nov. 3, 1997.

"Low–Voltage/Low–Power Integrated Circuits and Systems", Ed. By E. Sànchez–Sinencio and A.G. Andreou, IEEE Press Series on Microelectronic Systems, p. 177.

Introduction to VLSI Systems, C. Mead and L. Conway, pp. 18–20.

"Thermocouple Signal Conditioning Using the AD594/AD595", J. Marcin, Analog Devices.

* cited by examiner

Primary Examiner—Brian Young
Assistant Examiner—John Nguyen
(74) Attorney, Agent, or Firm—David L. Stewart; Steven Lin

(57) ABSTRACT

Techniques are disclosed for permitting low power operation of a signal processing circuit, such as a mixed signal processing circuit, by operating devices of the digital signal processing side at an energy-delay minimum. To permit this to occur, the negative logic supply rail of the digital signal processing circuit is operated at a negative potential. This negative potential is generated using a charge pump on an integrated circuit chip which can be also used to create a negative substrate potential. A positive logic supply rail can be generated using a DC to DC converter or voltage regulator. The potential of the positive logic supply rail can be negative, as long at it is more positive than the potential of the negative logic supply rail.

45 Claims, 4 Drawing Sheets

ANALOG TO DIGITAL CONVERTER HAVING DIGITAL SIGNAL PROCESSING WITH A NEGATIVE LOGIC SUPPLY RAIL

FIELD OF THE INVENTION

The invention relates to mixed signal processing and more particularly to an analog to digital converter having a negative bias generator providing a negative logic supply rail for powering digital processing circuitry.

BACKGROUND OF THE INVENTION

Mixed signal processing techniques are known in which an analog signal is converted to digital, processed in digital and then the output is provided in either analog or digital form. Techniques of this nature find frequent application in such diverse fields as audio circuits and industrial instrumentation.

Thermocouples are a type of sensor used in industrial instrumentation. They have two dissimilar metals, welded together, producing almost a dead ohmic short but with a strange, few millivolt temperature-dependent series potential. Thermocouples are sometimes placed in ovens with grounded inside surfaces. If one were to insulate the thermocouple from the inside of the oven, one would slow down its response to temperature transients. If one were required to bias the thermocouple up to a voltage, such as 1.5V, to allow analog signal circuitry such as analog to digital converters operating between 0V and 3V enough headroom to work accurately, and if one does not insulate the thermocouple, there would be a risk of sparks occurring from accidental contact between the thermocouple and the wall of the oven.

One would like to connect one side of the thermocouple to the same potential as the inside surface of the oven. This can be done by operating an ADC between a positive and negative potential (e.g. between −1.5V and +1.5V) and allowing the thermocouple to operate at zero V, the same potential as the grounded oven wall. However, one does not wish to buy an extra power supply in order to provide both +1.5V and −1.5V to an integrated circuit processing thermocouple signals. A single 3V supply is much cheaper.

Accordingly, it would be desirable if the problems associated with the prior art techniques could be overcome.

SUMMARY OF THE INVENTION

The problems of the prior art are overcome, in one embodiment of the invention by providing a negative bias generator to which analog, digital or both analog and digital processing may be referenced.

In another embodiment of the invention, the power consumed by digital processing circuitry in a mixed signal application is minimized by allowing the digital circuitry to operate referenced to a negative logic supply rail (for P substrate technologies) so that devices implementing the digital circuitry can operate at or near an energy or energy-delay minimum.

The foregoing and other features, aspects and advantages of the present invention will become more apparent from the following detailed description of the present invention when taken in conjunction with the accompanying drawings.

DESCRIPTION OF THE PREFERRED EMBODIMENT

Figure 1:
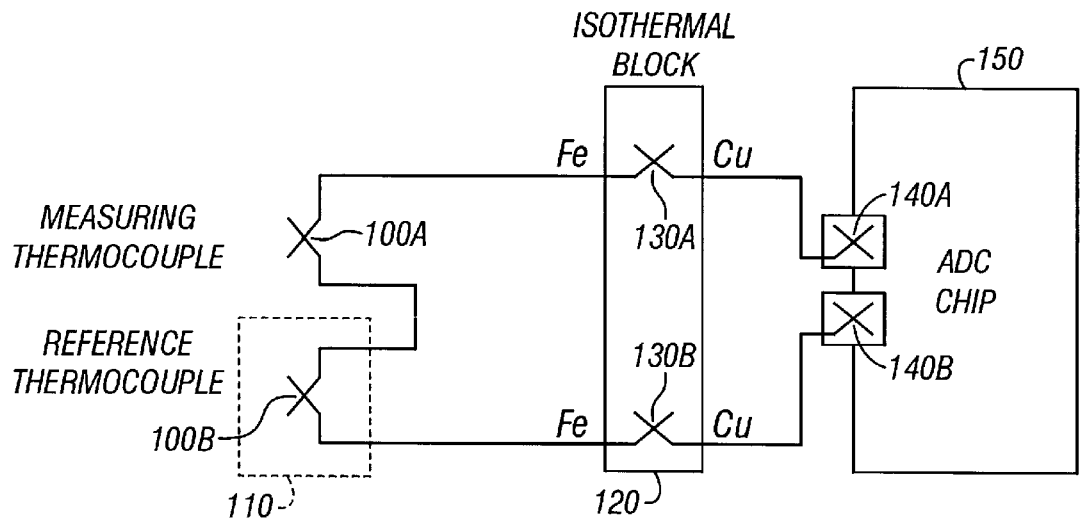
FIG. 1 is a schematic diagram of a thermocouple arrangement for measuring temperature.

FIG. 1 is a schematic diagram of a thermocouple arrangement for measuring temperature. In this arrangement, a pair of thermocouples 100A and 100B are connected in series. Thermocouple 100A is a measuring thermocouple and thermocouple 100B is a reference thermocouple. The reference thermocouple may be maintained at a reference temperature in an oven. In the arrangement shown in FIG. 1, the thermocouples 100A and 100B are connected to an integrated circuit chip 150 that, in this example, contains an analog to digital converter. The connection is made on an isothermal block 120. As shown in FIG. 1, if the leads coming from the thermocouples 100A and 100B are made of iron, the connection on the isothermal block 120 may be to copper leads going to the ADC chip 150. The connections shown at 130A and 130B, by virtue of being between dissimilar metals, introduce parasitic thermocouple voltages. Similarly, the coupling of copper wire to the ADC chip input pins introduce parasitic thermocouples 140A and 140B at the input to the ADC chip 150. However, these parasitic thermocouples introduce substantially identical voltages that occur in common mode and can therefore be eliminated by input circuitry with high-common mode rejection.

Each of the thermocouples, both intended and parasitic, are very much temperature sensitive.

Figure 2:
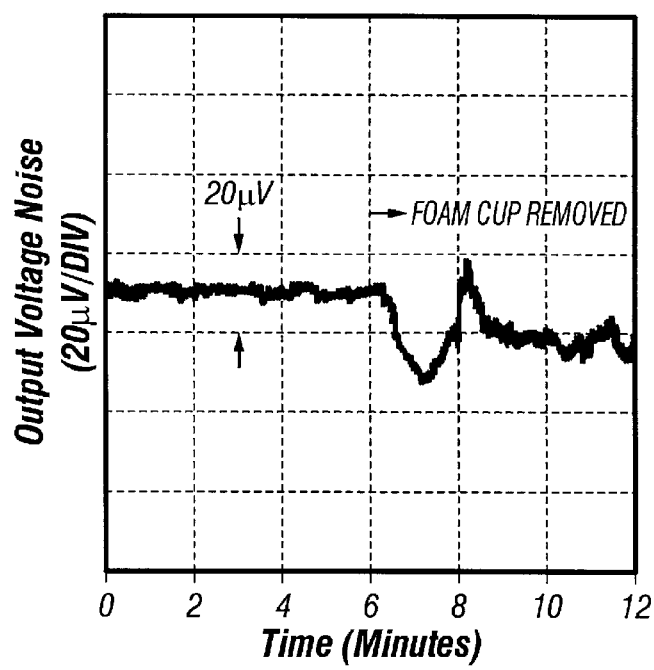
FIG. 2 is a graph indicating the amount of noise induced by air turbulence associated with a thermocouple.

FIG. 2 is a graph indicating the amount of noise induced by air turbulence associated with a thermocouple. Variations in thermal resistance caused by uneven air flow, create differential lead temperatures, thereby causing thermoelectric voltage noise at the output of the reference. As shown in FIG. 2, the time period from 0 to 6 minutes represents the noise experienced from a thermocouple that had been shielded from ambient air with a small foam cup. The cup was then removed for the second half of the trace (6–12 minutes). The ambient in both cases was a lab environment with no excessive air turbulence from air conditioners, opening/closing doors, etc. Removing the foam cup increased the output noise by almost an order of magnitude in the 0.01 Hz to 1.0 Hz band.

Returning to FIG. 1, the thermosensitivity discussed in conjunction with FIG. 2 is one reason why precautions are taken when connecting thermocouples such as the use of the isothermal block 120 shown in FIG. 1.

In addition to thermosensitivity, the arrangement shown in FIG. 1 is vulnerable to magnetically-coupled noise, such as that which may be coupled from current changes in a heating unit. ADC input circuits typically contain both series resistors and ESD protection diodes, and interference spikes can cause currents to flow in the diodes and disturb the apparent temperature reading. For example, a 0.7V interface spike can readily cause a 1 microamp transient current, which yields a 10 microvolt error signal if it flows through a series resistance of only 10 ohms. Such an error is roughly equivalent to that caused by turbulent air flow as shown in FIG. 2.

Figure 3A:
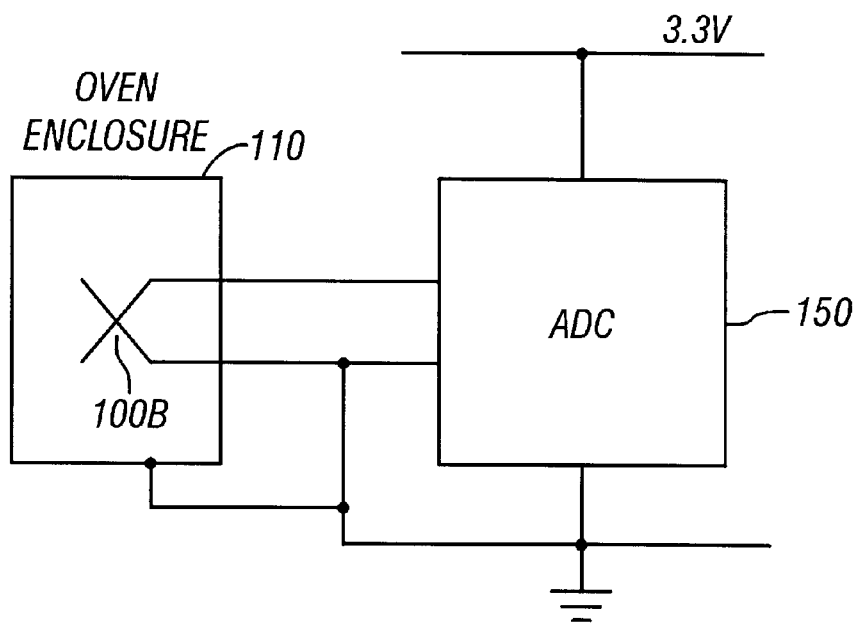
FIG. 3A is a block diagram showing a thermocouple arrangement in an oven enclosure.

FIG. 3A is a block diagram showing a thermocouple arrangement in an oven enclosure. When a thermocouple 100B is placed in an oven enclosure 110, and connected to an ADC 150, one option would be to have one side of the thermocouple connected to the ADC negative supply. In this case, protection diodes inside the ADC will conduct if interference pickup causes the other side of the thermocouple to go below −0.7V.

Figure 3B:
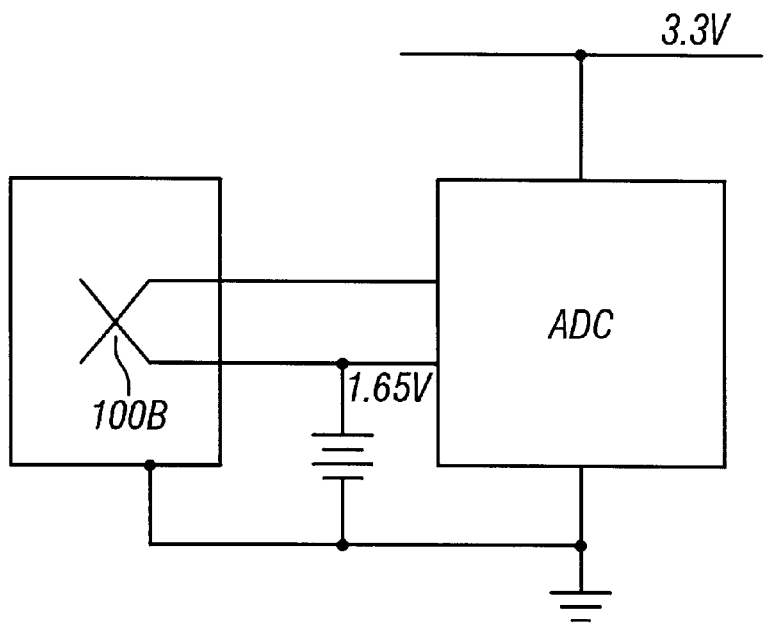
FIG. 3B is a block diagram showing a thermocouple arrangement in an oven enclosure in which the thermocouple is biased to operate above ground potential.

FIG. 3B is a block diagram showing a thermocouple arrangement in an oven enclosure in which the thermocouple is biased to operate above ground potential. In this case, protection diodes will not conduct unless interference pickup exceeds 1.65V+0.7V=2.35V, a factor of 3 better than FIG. 3A. This however creates a potential problem with sparking when the thermocouple is placed inside an oven enclosure which is grounded. If the thermocouple accidentally comes in contact with the oven enclosure, measurement or power-supply circuitry can be damaged. One can insulate the thermocouple from the oven wall; however, this would reduce the thermal responsiveness.

Figure 4:
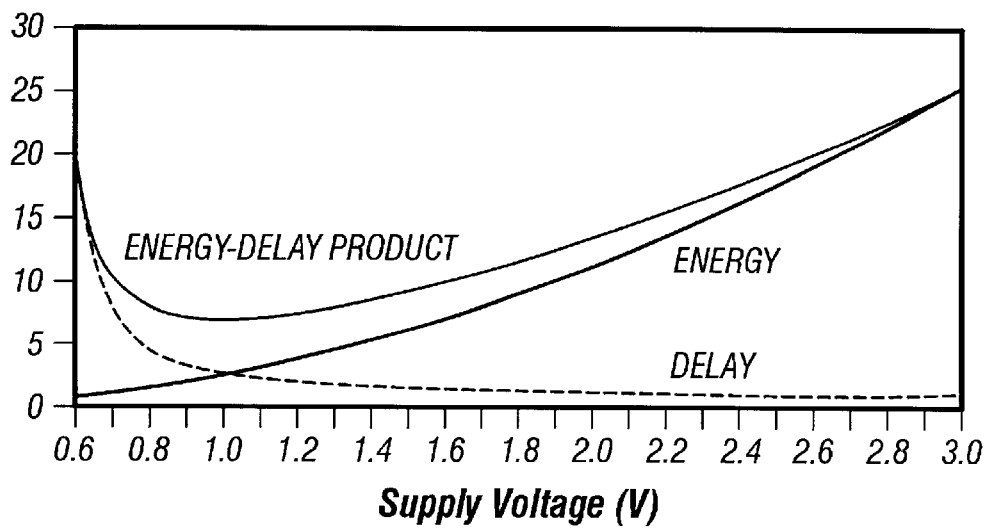
FIG. 4 is a graph showing energy-delay relationships when scaling supply voltage to semiconductor circuits.

FIG. 4 is a graph showing energy-delay relationships when scaling supply voltage to semiconductor circuits such as CMOS devices. The graph shows normalized delay, energy and energy-delay product as a function of supply voltage. Delay is normalized to the delay value at the largest supply voltage (3 volts), and energy is normalized to energy value at the smallest supply voltage (0.6 volts). One can see that the delay values are very high as the voltage is reduced toward the 0.6 volt level. Similarly, energy consumption is very high as supply voltages increase to the 3.0 volt level. One can see from the drawing that the energy-delay product has a minimum in the general area of 1.0 volt. Therefore, it would be desirable to operate CMOS devices at about a 1 volt level in order to minimize the energy delay product, and thus minimize power consumption in the devices without significantly adversely impacting delay. For switching speeds normally found in ADCs, the delay may not be a significant factor, but operating at an energy minimum is very important.

Figure 5A:
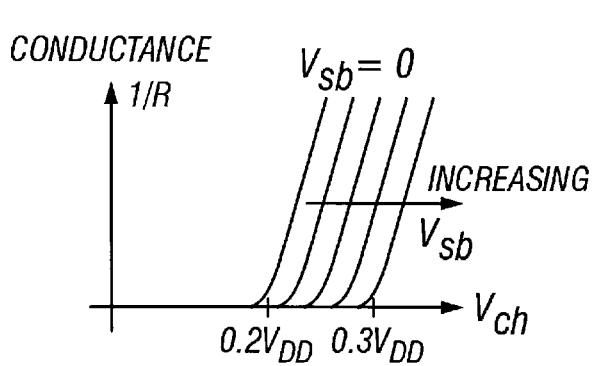
FIG. 5A is a graph illustrating a body effect in a MOS transistor.

FIG. 5A is a graph illustrating a body effect in a MOS transistor. The threshold voltage of a MOS transistor is not a constant; it varies slightly as a function of the voltage between the source terminal of the transistor and the silicon substrate. This variation is called the body effect, and it is illustrated in FIG. 5A. The silicon substrate is usually connected to a circuit ground during packaging. However, a fixed bias voltage is sometimes applied between circuit ground and the substrate, and this fixed bias voltage must be taken into account in estimating the body effect. If the source-to-bulk (substrate) voltage $V_{sb}=0$, then $V_{th}$ is at its minimum value of approximately 0.2 VDD. As $V_{sb}$ is increased, $V_{th}$ increases.

Figure 5B:
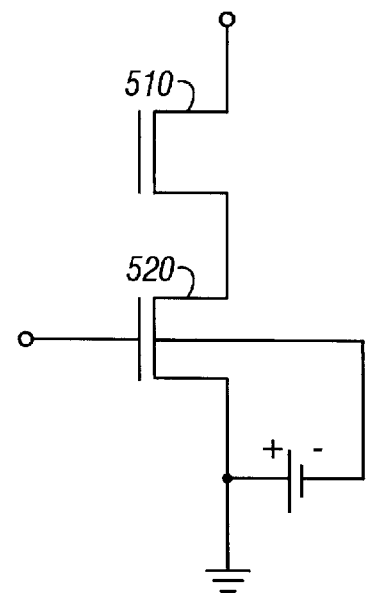
FIG. 5B is a schematic diagram illustrating problems caused by body effect.

FIG. 5B is a schematic diagram illustrating problems caused by body effect. The impact of body effect on a circuit, such as shown in FIG. 5B, is that the body effect raises the threshold of an N channel device by about 0.3 volts for every volt between the N-channel source and the substrate. It is also clear that a CMOS inverter will not work if the N channel cannot turn on. This situation means that if one were to operate the circuit shown in FIG. 5B with a −2.0 volt negative bias voltage, then the N-channel threshold would be raised from 0.7 volt, when the substrate was at 0 volt, to 1.3 volts when the substrate is at −2 volts. Under these circumstances, the inverter would need a VDD of at least 1.3 volts which is getting away from the energy delay optimum shown in FIG. 4.

Figure 6:
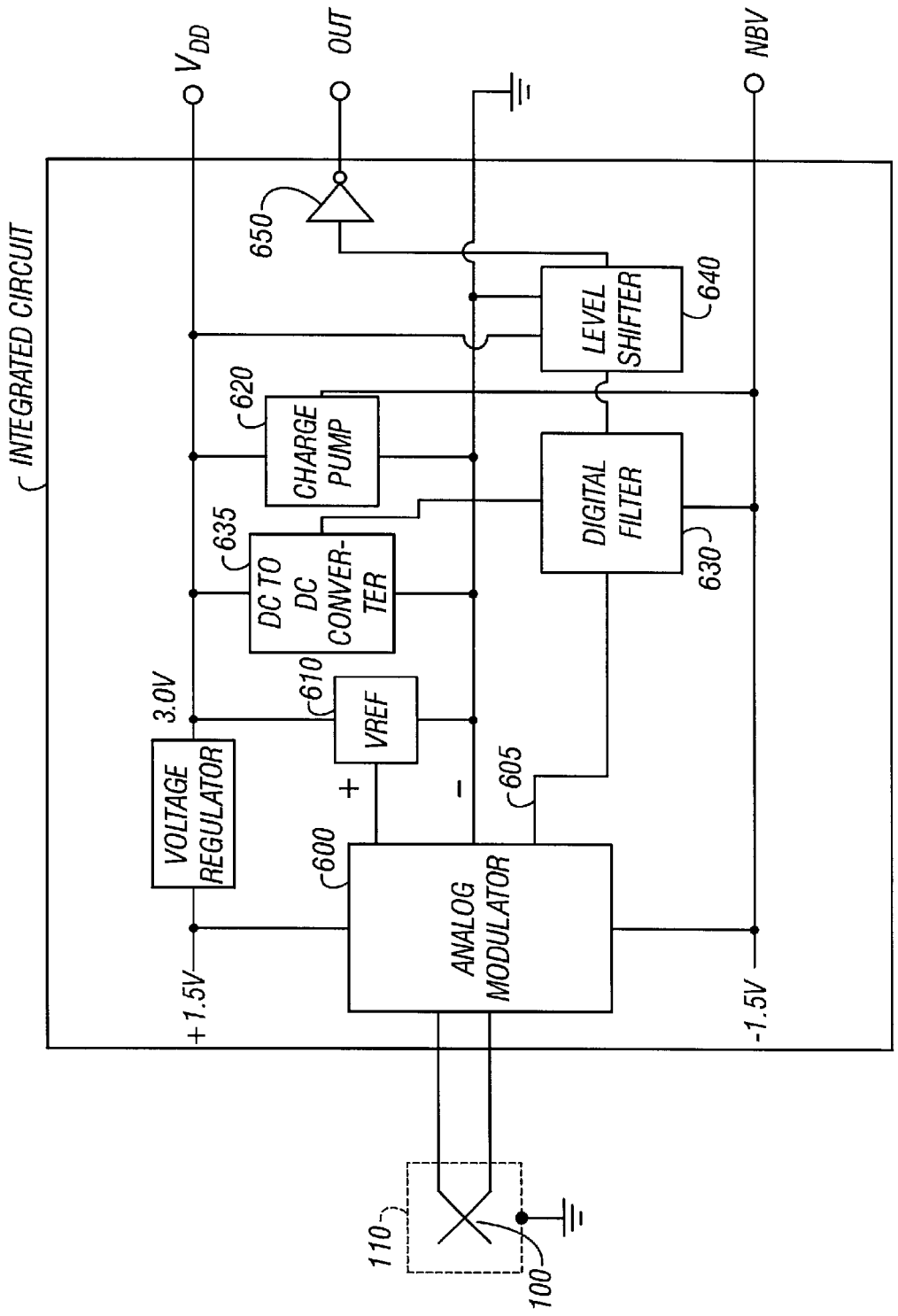
FIG. 6 is a block diagram of a thermocouple measuring arrangement in accordance with one aspect of the invention.

FIG. 6 is a block diagram of a thermocouple measuring arrangement in accordance with one aspect of the invention. Signal voltage across thermocouple 100 is applied to an analog to digital modulator 600. In a preferred embodiment, this modulator is a delta-sigma modulator which produces a stream of 1-bit digital values on line 605 which represent the input signal. The sampling of the thermocouple signal is done with respect to $V_{ref+}$ and $V_{ref-}$, with $V_{ref+}$ being generated by source 610 and $V_{ref-}$ being signal ground. The 1-bit digital output 605 is applied to digital filter 630.

Most of the power associated with the analog to digital converter chip shown in FIG. 6 is consumed in the digital filter. Therefore it is important that the digital filter 630 operate with the least power possible, or in other words, substantially at the energy delay minimum shown in FIG. 4. A charge pump 620, connected between VDD and ground generates a negative bias voltage (NBV) with respect to which the digital filter and other circuitry can be operated. In the circuit shown, if the charge pump 620 were to generate a negative bias voltage of −1 volt, the potential across a digital filter would be substantially that required for the energy delay minimum shown in FIG. 4. However, if other considerations dictated any different negative bias voltage, one could adjust the voltage across digital filter 630 to be substantially 1 volt either by voltage regulation (not shown) or by use of a DC to DC converter 635 (shown). The output of the digital filter can then be applied to level shifter 640 to produce the desired voltage swing for application to the output driver 650.

A second advantage to the configuration shown in FIG. 6 is that the thermocouple 100 is referenced to $V_{ref-}$ (signal ground). Thus, if thermocouple 100 were placed in an oven 110, and the oven were grounded, then there would be no danger of sparking. Additionally, the thermocouple 100 would operate at the midrange of the delta-sigma modulator 600 where the modulator is very accurate.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A mixed signal processing circuit comprising:
   a. an analog circuitry; and
   b. a circuit for performing digital signal processing on the output of said analog circuitry wherein said circuit is supplied with a logic supply rail at a negative potential which is supplied by a charge pump and a positive logic supply rail at a potential that is generated using a DC to DC converter;
      wherein said analog circuitry and said circuit for performing digital signal processing are located on an integrated circuit.

2. The mixed signal processing circuit of claim 1 in which the charge pump provides a negative bias value to a substrate of the integrated circuit.

3. The mixed signal processing circuit of claim 1 in which said positive logic supply rail is at a potential that is positive with respect to said negative supply rail.

4. The mixed signal processing circuit of claim 1 in which said positive logic supply rail is generated using a voltage regulator.

5. The mixed signal processing circuit of claim 1 in which at least one semiconductor device used to implement said circuit for performing digital signal processing is biased to operate substantially at or below an energy-delay minimum.

6. The mixed signal processing circuit of claim 1 in which a signal from said circuit for performing digital signal processing on the output of said analog circuitry is connected to a level shifter and the output of the mixed signal processing circuit is taken from said level shifter.

7. The mixed signal processing circuit of claim 1 in which said analog circuitry comprises an analog to digital converter.

8. The mixed signal processing circuit of claim 7 in which said analog to digital converter comprises a delta sigma modulator.

9. The mixed signal processing circuit of claim 1, further comprising a level shifter for shifting a level of a signal from digital signal processing to produce an output signal.

10. A signal processing circuit comprising:
   a. a sensor; and
   b. a circuit for performing digital signal processing on the output of said sensor wherein said circuit is supplied with a negative logic supply rail at a negative potential and a positive logic supply rail at a potential that is generated using a dc to dc converter.

11. The signal processing circuit of claim 10 in which said potential for said positive logic supply rail is negative but more positive than the potential of said negative potential.

12. The signal processing circuit of claim 10 in which said sensor is supplied with the same potential as the negative potential of said positive logic supply rail.

13. The signal processing circuit of claim 10 in which said circuit for performing digital signal processing is located on an integrated circuit and said sensor is located off said integrated circuit.

14. The signal processing circuit of claim 10 in which the negative logic supply rail is supplied by a charge pump.

15. The signal processing circuit of claim 10, further comprising a level shifter for shifting a level of a signal from digital signal processing to produce an output signal.

16. An instrumentation system comprising:
   a. a sensor;
   b. an analog to digital converter circuit for converting an output signal from said sensor to a digital signal;
   c. a circuit for performing digital signal processing on the digital signal wherein said circuit is supplied with a negative logic supply rail at a negative potential and a positive logic supply rail at a potential that is generated using a dc to dc converter; and
   d. an output circuit, receiving an output of said circuit for performing digital signal processing, which produces an indicative value of said output signal.

17. The system of claim 16, in which said instrumentation system is a scale.

18. The system of claim 16, in which said instrumentation system measures temperature.

19. The system of claim 16, further comprising a level shifter for shifting a level of the digital signal to produce a level-shifted output signal.

20. A method of operating a mixed signal processing circuit having an analog to digital converter and a circuit for performing digital signal processing on the output of said analog to digital converter, comprising the step of:

supplying said circuit for performing digital signal processing with a negative logic supply rail at a negative potential which is supplied by a charge pump and a positive logic supply rail at a potential that is generated using a DC to DC converter.

21. The method of claim 20, further comprising the step of supplying a sensor, wherein the output of the sensor is connected to a reference potential of said analog to digital converter which is positive with respect to said negative logic supply rail.

22. The method of claim 20, further comprising shifting a level of a signal from digital signal processing to produce an output signal.

23. A method of operating a mixed signal processing circuit having an analog to digital converter and a circuit for performing digital signal processing on the output of said analog to digital converter, comprising the step of:
   biasing at least one component of said circuit for performing digital signal processing to operate substantially at or below an energy-delay minimum; and
   supplying said circuit for performing digital signal processing with a negative logic supply rail at a negative potential which is supplied by a charge pump and with a positive logic supply rail at a potential that is generated using a DC to DC converter.

24. The method of claim 23, further comprising shifting a level of a signal from digital signal processing to produce an output signal.

25. A method of operating a signal processing circuit having a sensor and a circuit for performing digital signal processing on the output of said sensor, comprising the step of:
   supplying said circuit for performing digital signal processing with a negative logic supply rail at a negative potential and a positive logic supply rail at a potential that is generated using a dc to dc converter.

26. The method of claim 25, further comprising shifting a level of a signal from digital signal processing to produce an output signal.

27. A method of operating a signal processing circuit comprising a sensor and a circuit for performing digital signal processing on the output of said sensor comprising the step of:
   biasing at least one component of said circuit for performing digital signal processing to operate substantially at or below an energy-delay minimum; and
   supplying said circuit for performing digital signal processing with a negative logic supply rail at a negative potential which is supplied by a charge pump and with a positive logic supply rail at a potential that is generated using a DC to DC converter.

28. The method of claim 27, further comprising shifting a level of a signal from digital signal processing to produce an output signal.

29. An integrated circuit, comprising:
   a. an analog circuit operating between a first positive voltage supply and a first negative voltage supply;
   b. a digital circuit operating between a negative voltage supply for the digital circuit and a digital supply that is positive with respect to said negative voltage supply for the digital circuit, wherein the negative voltage supply for the digital circuit operates at the more negative of said first negative voltage supply and said negative voltage supply for the digital circuit; and
   c. an internal power supply circuit producing said first positive voltage supply, said first negative voltage supply, said negative voltage supply for the digital circuit and said digital supply from a single external power input to said integrated circuit.

30. The integrated circuit of claim 29 in which said single external power input is configured to accommodate substantially 3 volts.

31. The integrated circuit of claim 29 in which said first positive voltage supply is substantially +1.5 volts.

32. The integrated circuit of claim 29 in which said first negative voltage supply is substantially −1.5 volts.

33. The integrated circuit of claim 29 in which said digital supply is substantially −0.5 volt.

34. The integrated circuit of claim 29 in which said first negative voltage supply for the digital circuit is substantially −1.5 volts.

35. The integrated circuit of claim 29 in which the output of said digital circuit is applied to a level shifter and the output of the level shifter is applied to one or more output pins of said integrated circuit.

36. The integrated circuit of claim 35 in which the output voltages of the level shifter are substantially 0 and 3 volts.

37. The integrated circuit of claim 35 in which the output voltages of the level shifter are substantially 0 and 5 volts.

38. The integrated circuit of claim 29 in which said first negative voltage supply and said negative voltage supply for the digital circuit are configured to operate at the same potential.

39. The integrated circuit of claim 38 in which the same potential is supplied by a single charge pump.

40. The integrated circuit of claim 29 in which said first negative voltage supply and said negative voltage supply for the digital circuit are configured to operate at different potentials.

41. The integrated circuit of claim 40 in which the different potentials are supplied by respective charge pumps.

42. The integrated circuit of claim 29 in which said analog circuit is an analog to digital converter.

43. The integrated circuit of claim 29 in which said digital circuit comprises a digital signal processor.

44. The integrated circuit of claim 29 in which said analog circuit has an input connected to one or more external pins.

45. The integrated circuit of claim 44 in which said one or more external pins are connected to a thermocouple.

* * * * *